United States Patent [19]

Yu et al.

[11] Patent Number: 5,188,723
[45] Date of Patent: Feb. 23, 1993

[54] SELECTIVE ELECTRO-DEPOSITION AND CIRCUIT PATTERNING TECHNIQUE

[75] Inventors: Chris C. Yu; Gurtej S. Sandhu; Terry Gilton, all of Boise, Id.

[73] Assignee: Micron Technology, Inc., Boise, Id.

[21] Appl. No.: 867,345

[22] Filed: Apr. 13, 1992

[51] Int. Cl.$^5$ .............................................. C25D 5/02
[52] U.S. Cl. .................................................. 205/125
[58] Field of Search ......................................... 205/125

[56] References Cited

U.S. PATENT DOCUMENTS 4,988,412  1/1991  Liu ..................................... 205/118

Primary Examiner—T. M. Tufariello
Attorney, Agent, or Firm—Henri J. A. Charmasson

[57] ABSTRACT

A process for selectively electrodepositing a pattern of metal such as copper on a substrate comprises the deposition of two successive layers over the entire substrate, photolithographic patterning of the upper layer, and placement of the exposed part of the first deposited layer to a lower surface potential then the patterned second layer. The metal is then deposited under a periodical modulated voltage signal that is adjusted in reference to the reduction potential of the metal so that any metal deposited on the exposed part of the first layer during the positive duty cycle of the signal is removed during the negative duty cycle while little or none of the metal deposited on the second layer is removed due to the second layer higher surface potential. The remaining exposed part of the first layer is etched away after the electrodeposition process is terminated.

12 Claims, 1 Drawing Sheet

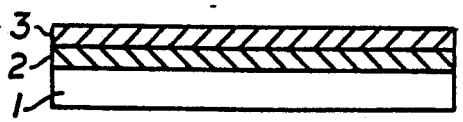
FIG. 1
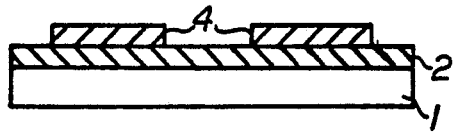
FIG. 2
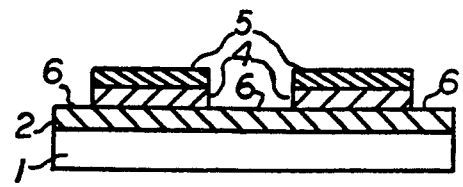
FIG. 3
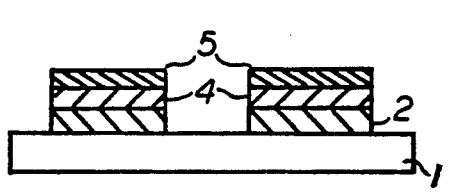
FIG. 4
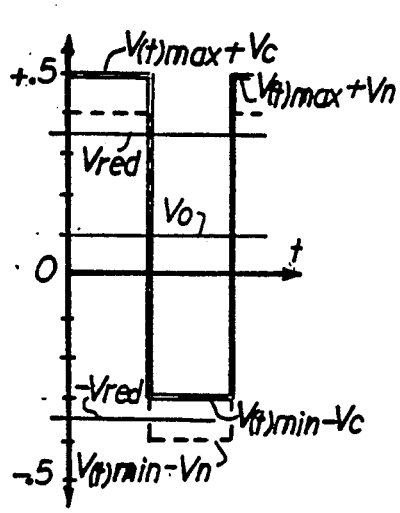
FIG. 5
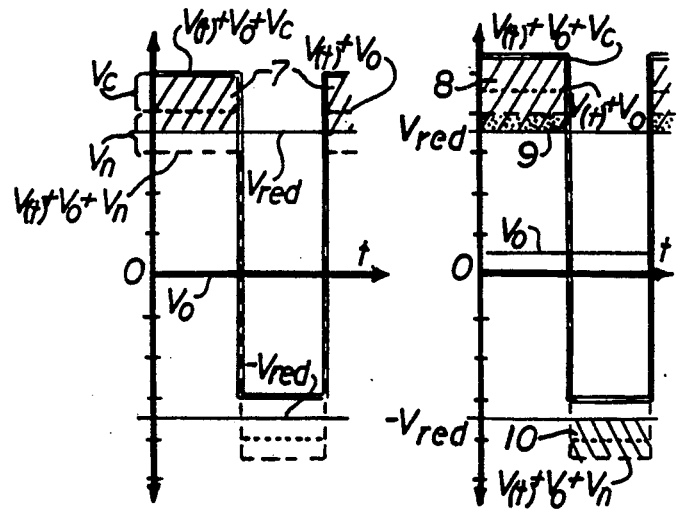
FIG. 6
FIG. 7
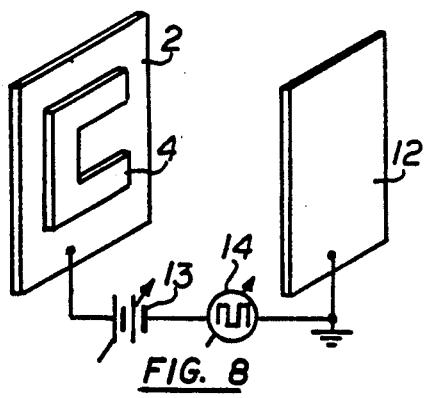
FIG. 8
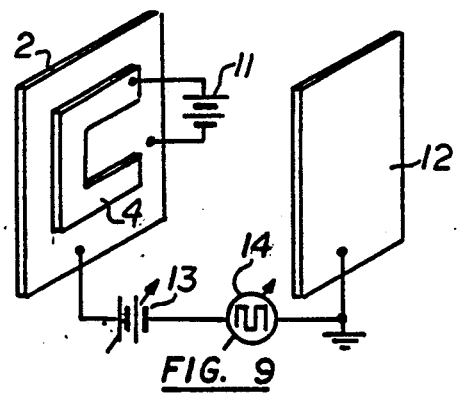
FIG. 9

SELECTIVE ELECTRO-DEPOSITION AND CIRCUIT PATTERNING TECHNIQUE

FIELD OF THE INVENTION

This invention relates to the fabrication of integrated circuit devices, and more particularly to the electro-deposition of a patterned layer of conductive material.

BACKGROUND OF THE INVENTION

The industry continuous need for ever more compact and intricate integrated circuit packages can no longer be met by conventional manufacturing techniques. At the submicronscale of modern circuitry, conductive pattern definition has become increasingly difficult. It would be advantageous to develop a direct metal line patterning technique which would avoid the multiple photolithographic and etching steps which are now required.

SUMMARY OF THE INVENTION

The principal and secondary objects of this invention are to circumvent the conventional photolithographic and etching steps now required for defining conductive metal lines on an integrated circuit substrate; and to provide a more precise and more direct way of forming those lines.

These and other objects are achieved by electro-plating adjacent substrate layers under a bi-polar modulated voltage signal while the adjacent layers are subjected to different surface potentials. The signal positive and negative peaks are calculated to deposit the metal on both layers during positive duty cycles while removing during the negative duty cycles only the metal deposited on one of the layers.

BRIEF DESCRIPTION OF THE DRAWING

FIG. 1 is a diagrammatic illustration of the two intermediary layer deposits;

FIG. 2 illustrates the patterning of the second layer;

FIG. 3 illustrates the deposit of the patterned metal layer;

FIG. 4 illustrates the final circuit;

FIGS. 5-7 are waveform diagrams illustrating various choices of surface potential and modulated signal amplitudes; and FIGS. 8-9 are diagrams of the electrical system.

DESCRIPTION OF THE PREFERRED EMBODIMENTS OF THE INVENTION

The invention is based on a selective electro-deposition of a metal upon one out of two adjacent surfaces subjected to different surface potentials under a bi-polar modulated plating voltage. With reference to FIG. 5 and for the sake of explanation, let us assume that copper is being electro-deposited over two adjacent areas of substrates C and N, and that area C has a surface potential $V_c$ that is 0.1 volt higher than the potential $V_n$ of the adjacent area N. Let us also assume that the electro-deposition is done under a voltage signal modulated by a square wave $V(t)$ having a peak-to-peak amplitude of 0.8 volt. Accordingly, the voltage at each area will be the sum of its surface potential and the modulated signal. When the modulated signal is at its maximum peak the plating potential $V(t)max + V_c$ will be 0.5 volts for the first area C, and $V(t)max + V_n$ will be 0.4 volts for the second area N. When the modulated signal reaches its lowermost excursion the plating potential $V(t)min + V_c$ for the first area C will be −0.3 volt, while the potential at the surface of the second area N $V(t)min + V_n$ will be −0.4 volt.

Since copper has a reduction potential $V_{red}$ of 0.342 volts and an oxidation potential or reverse deposition potential of −0.342 volts, the metal will be deposited upon the first area C and the second area N during the positive duty cycle of the modulated signal. However, during the negative duty cycle of the signal the plating potential for the first area C drops only to −0.3 volt, thus avoiding any reverse deposition. By contrast, the plating potential for the second area N drops to −0.4 volts and whatever metal has been deposited on the second area N during the positive duty cycle is removed during the negative duty cycle.

This selective depositing technique is ideally suited for the deposition of metals such as copper which are difficult to etch by conventional techniques on integrated circuit substrates.

Referring now to the drawing, the various steps of the process will be disclosed in connection with the patterning of a copper circuit over a micro-circuit substrate 1.

In a first step, and prior to electro-deposition, a first substrate layer 2 is deposited on the initial substrate 1. This first layer should preferably be of a material that either has a relatively slow electro-deposition rate or a more negative innate surface potential in the electro-deposition bath than the next layer. An example of such a material would be a poly-silicon.

A second conductive substrate layer 3 is then deposited over the first layer. This second layer should be of a material that exhibits better electro-deposit acceptability than the material of the first layer and preferably a more positive innate surface potential. Such a second layer could be made of rapid thermal annealed titanium nitride or of a reactively spattered titanium nitride. This difference in the electro-deposit acceptability of the two layers 2, 3 is not absolutely necessary for the practice of the inventive process, but contributes substantially to its efficiency. If the materials do not exhibit an inherent difference in their surface potentials, that difference can be imposed externally as will be explained below.

The pattern of the desired copper circuit is then formed out of the second layer 3 by conventional photolithographic and wet or dry etching techniques, the results of which are illustrated in FIG. 2. The first layer 2 is then placed at a surface potential $V_n$, and the remaining patterned portions 4 of the second layer 3 are placed at a higher surface potential $V_c$ than the first layer 2. The electro-deposition of the copper is then initiated under the modulated voltage signal to form the deposit illustrated in FIG. 3 over the second layer. At part 6 of the first layer 2 which is not covered by the patterned remainder of the second layer 4 and the copper circuit 5 is then removed by conventional etching method to yield the final circuit illustrated in FIG. 4.

The necessary conditions to the practice of the above-described process can be expressed by the following relationships between the peak levels $V(t)max$ and $V(t)min$, and the reference or average level $V_o$ of the periodic modulated voltage $V(t)$, the metal reduction potential $V_{red}$, and the respective surface potential $V_c$ and $V_n$ of the second layer C to be metalized and first layer N that should not be metalized.

The basic principle that the total time spent depositing metal upon layer C must be longer than any stripping time can be expressed by $$\int_{V_{red}}^{V(t)max + V_c} > \int_{-V_{red}}^{V(t)min + V_c}$$

The basic principle that the total time spent stripping metal from layer N must be equal or greater than the total time spent depositing can be expressed by $$\int_{-V_{red}}^{V(t)min + V_n} \geq \int_{V_{red}}^{V(t)max + V_n}$$

providing that
$V(t)max + V_c > V_{red}$
$V(t)min + V_n < -V_{red} < V(t)min + V_c$ and
$V_o < V_{red}$ Finally, one must take into account the bath electrolysis potential $V_e$ which varies with the material used for the electrode but tends to gravitate around plus or minus 1.5 volts so that $$V(t)max \ V_e < V(t)min$$

Some particular plating situations will now be discussed with reference to FIGS. 6 and 7.

Let us suppose we now have a situation as in FIG. 2 where there are two layers — a patterned one 4 of surface potential $V_c$ and a non-patterned background layer 2 of potential $V_n$. And let us suppose that $V_o = 0$ and that $V_n < V_c$, that is to say that at any time during the application of the modulated voltage V(t), $V(t) + V_c > V(t) + V_n$. And let us further suppose that we have an adequate solution of a metal ion with reduction potential $V_{red}$. Now, let $V_n = -V_c$.

As shown in FIG. 6, deposition would only occur during the time the modulated voltage V(t) was in the cross-hatched region 7 where $$V(t) + V_o + V_c > V_{red}$$

It can be seen that since the plating voltage never gets below $-V_{red}$, there will never be any stripping.

In the situation illustrated in FIG. 7, deposition of the metal occurs on the patterned layer 4 during the time indicated by the cross-hatched area 8 when $$V(t) + V_o + V_c > V_{red}$$

Deposition occurs on the background layer during the time illustrated by cross-hatched and stippled area 9 when $$V(t) + V_o + V_n > V_{red}$$

However, when $V(t) + V_o V_n < V_{red}$ stripping of the background layer occurs during the period corresponding to the cross-hatched zone 10 below zero. The net effect will be metalization of the patterned layer 4 exclusively.

FIGS. 8 and 9 illustrates the electrical conditioning of the various layers. During the deposition phase of the process the patterned C layer 4 must be cathodic. The background N layer 2 may also be cathodic. During the stripping phase, the C layer should remain cathodic but the N layer must be anodic in order to cause an oxidation of the metal ions. The appropriate biasing of the respective layers can be achieved in various ways. As illustrated in FIG. 8, the difference in surface potential between layers C and N can be the result of interaction between the electrolyte and the materials surfaces. One can select for layer C a material with a double layer potential high enough that it would not be overcome during the deposition phase of the modulated voltage V(t), while the material of layer N is selected among those more favorable to oxidation. Copper can be plated, for instance, over a C layer of Titanium nitride while avoiding deposition on an N layer of doped silicon.

As illustrated in FIG. 9, the potential difference between the C and N layers may be created by an external source 11. The modulated voltage V(t) applied between the metal electrode 12 and one of the layers 2 or 4 can be adjusted by varying either the DC voltage source 13 and/or the amplitude of the modulating voltage generator 14.

While the preferred embodiments of the invention have been described, modifications can be made and other embodiments may be devised without departing from the spirit of the invention and the scope of the appended claims.

What is claimed is:

1. A method for selectively electro-depositing a material having a reduction potential upon a first surface while nullifying deposition of the metal over a second surface adjacent to the first surface, which comprises:
    placing the first surface at a first potential and the second surface at a second potential; and
    electro-depositing the material over said first and second surfaces under a modulated voltage having a positive duty cycle and a negative duty cycle wherein said potentials and voltage are adjusted to remove during said negative duty cycle any material deposited on the second surface during said positive duty cycle.

2. A method for selectively electro-depositing material having a reduction potential $V_{red}$ upon a first structure having a first surface potential $V_c$ while inhibiting deposition of said material over a second structure adjacent to the first structure and having a second surface potential $V_n$, which comprises:
    applying to said surfaces a periodical modulated voltage signal V(t) having a peak level V(t)max, a valley level V(t)min and an average level $V_o$ such that:

$$\int_{-V_{red}}^{V(t)min + V_n} \geq \int_{V_{red}}^{V(t)max + V_n}$$

and $$\int_{V_{red}}^{V(t)max + V_c} > \int_{-V_{red}}^{V(t)min + V_c}$$

3. The method of claim 2, wherein:

$$V_o < V_{red}$$

4. The method of claim 3, wherein:

$$V(t)max + V_c > V_{red}$$

5. The method of claim 4, wherein:

$$V(t)min + V_n < -V_{red} < V(t)min + V_c$$

6. In the fabrication of an integrated circuit device, a metalization process for electro-depositing a material having a reduction potential $V_{red}$ over a first area of a substrate while reversing deposition of the material over a second area of the substrate adjacent to the first area, which comprises the successive steps of:
   depositing a first conductive layer over both areas;
   depositing a second conductive layer over said deposited first conductive layer;
   patterning the second layer by selectively removing parts of said second layer;
   applying to the first layer a first surface potential $V_n$;
   applying to the second layer a second surface potential $V_c$;
   electro-depositing the metal upon said first and second layers under a periodical modulated voltage signal V(t) having a peak level V(t)max and a valley level V(t)min and an average level $V_o$ such that $$\int_{-V_{red}}^{V(t)min + V_n} \geq \int_{V_{red}}^{V(t)max + V_n}$$

and $$\int_{V_{red}}^{V(t)max + V_c} > \int_{-V_{red}}^{V(t) + V_n}$$

$$V(t)max + V_c > V_{red}$$
$$V(t)min + V_n < -V_{red} < V(t)min + V_c;$$ and removing parts of the first layer not covered by remaining parts of the second layer.

7. The process of claim 6, wherein the step of removing parts of the first layer comprises etching off said parts.

8. The process of claim 6, wherein the step of depositing said second layer comprises depositing a conductive layer of material having a better electro-deposit acceptability than the first layer.

9. The process of claim 6, wherein the step of depositing said second layer comprises depositing a conductive layer of material having a better electro-deposit acceptance rate than said first layer.

10. The process of claim 6, wherein the step of depositing said second layer comprises depositing a conductive layer of material having a higher innate surface potential than said first layer.

11. The process of claim 10, wherein said second layer is a doped silicon layer.

12. The process of claim 11, wherein said first layer is a titanium nitride layer.

* * * * *